(12) United States Patent
Basker et al.

(10) Patent No.: US 8,557,657 B1
(45) Date of Patent: Oct. 15, 2013

(54) RETROGRADE SUBSTRATE FOR DEEP TRENCH CAPACITORS

(75) Inventors: Veeraraghavan S. Basker, Schenectady, NY (US); Wilfried E. Haensch, Somers, NY (US); Effendi Leobandung, Wappingers Falls, NY (US); Tenko Yamashita, Schenectady, NY (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/475,485

(22) Filed: May 18, 2012

(51) Int. Cl.
- H01L 27/108 (2006.01)
- H01L 29/00 (2006.01)
- H01L 31/036 (2006.01)
- H01L 31/112 (2006.01)
- H01L 21/8242 (2006.01)
- H01L 21/00 (2006.01)

(52) U.S. Cl.
USPC ........... 438/247; 438/243; 438/245; 438/246; 438/248; 257/E21.396; 257/68; 257/296; 257/300

(58) Field of Classification Search
USPC .................................................. 438/243–256
See application file for complete search history.

(56) References Cited

U.S. PATENT DOCUMENTS

| | | | |
|---|---|---|---|
| 4,578,218 A | 3/1986 | Saundry et al. | |
| 5,250,829 A * | 10/1993 | Bronner et al. | 257/301 |
| 6,057,188 A * | 5/2000 | El-Kareh et al. | 438/243 |
| 6,265,279 B1 | 7/2001 | Radens et al. | |
| 6,720,606 B1 * | 4/2004 | Nitayama et al. | 257/306 |
| 6,943,396 B2 | 9/2005 | McNeil | |
| 6,964,897 B2 * | 11/2005 | Bard et al. | 438/243 |
| 7,199,414 B2 | 4/2007 | Goldbach et al. | |
| 7,256,439 B2 | 8/2007 | Cheng et al. | |
| 7,465,642 B2 * | 12/2008 | Cheng et al. | 438/423 |
| 7,473,979 B2 * | 1/2009 | Clevenger et al. | 257/532 |
| 7,615,816 B2 | 11/2009 | Cheng et al. | |
| 7,655,967 B2 | 2/2010 | Cheng et al. | |
| 7,668,003 B2 * | 2/2010 | Barth et al. | 365/149 |
| 7,785,959 B2 * | 8/2010 | Cheng et al. | 438/242 |
| 8,053,823 B2 * | 11/2011 | Cheng et al. | 257/302 |
| 2008/0048186 A1 | 2/2008 | Cheng et al. | |
| 2011/0248326 A1 | 10/2011 | Kanakasabapathy et al. | |
| 2012/0286392 A1 | 11/2012 | Pei et al. | |

\* cited by examiner

*Primary Examiner* — Seahvosh Nikmanesh
*Assistant Examiner* — Evren Seven
(74) *Attorney, Agent, or Firm* — Tutunjian & Bitetto, P.C.; Vazken Alexanian

(57) ABSTRACT

A semiconductor device includes a substrate having a first doped portion to a first depth and a second doped portion below the first depth. A deep trench capacitor is formed in the substrate and extends below the first depth. The deep trench capacitor has a buried plate that includes a dopant type forming an electrically conductive connection with second doped portion of the substrate and being electrically insulated from the first doped portion.

18 Claims, 7 Drawing Sheets

RETROGRADE SUBSTRATE FOR DEEP TRENCH CAPACITORS

BACKGROUND

1. Technical Field

The present invention relates to semiconductor devices and processing, and more particularly to devices and methods for forming a buried plate for deep trench capacitors that permits a shallow well to be formed in a substrate.

2. Description of the Related Art

Deep trench capacitors include two electrodes. One electrode is formed by filling a deep trench with a conductor. The other electrode is formed in a region adjacent to the deep trench and is known as a buried plate. The buried plate and the conductor are separated by a dielectric layer. The deep trench buried plate requires a low resistance path to ground. This is achieved through the doping of the buried plate which connects the buried plate of each cell to ground.

Since the doped region around the deep trench (buried plate) takes up precious device area, the formation of wells and other structures in areas around the buried plate is not available. In addition, counter doping a heavily doped substrate is challenging especially when forming wells for other devices.

SUMMARY

A semiconductor device includes a substrate having a first doped portion to a first depth and a second doped portion below the first depth. A deep trench capacitor is formed in the substrate and extends below the first depth. The deep trench capacitor has a buried plate. The buried plate includes a dopant type forming an electrically conductive connection with second doped portion of the substrate and is electrically insulated from the first doped portion. A well is formed in the first doped portion above the first depth.

Another semiconductor device includes a semiconductor-on-insulator substrate having a bulk substrate, a buried dielectric layer and a semiconductor material, the bulk substrate including a first doped portion to a first depth and a second doped portion below the first depth. A memory cell comprises an access transistor formed in the semiconductor material and a deep trench capacitor formed in the bulk substrate. The deep trench capacitor extends below the first depth. The deep trench capacitor has a buried plate, and the buried plate includes a dopant type forming an electrically conductive connection with second doped portion of the substrate and being electrically insulated from the first doped portion. A well is formed in the first doped portion, the well having a different dopant type than the first doped portion.

Yet another semiconductor device includes a semiconductor-on-insulator substrate having a bulk substrate, a buried dielectric layer and a semiconductor material. The bulk substrate includes a first doped portion with a p− doping to a first depth and a second doped portion with an n+ doping below the first depth. A memory cell comprises a fin field effect access transistor formed in the semiconductor material and a deep trench capacitor formed in the bulk substrate. The deep trench capacitor extends below the first depth, and has a buried plate. The buried plate includes a dopant type forming an electrically conductive connection with second doped portion of the substrate and being electrically insulated from the first doped portion. A contact extends through the first doped portion into the second doped portion to provide an electrical path between the buried plate and a ground. A well is formed in the first doped portion, the well having a different dopant type than the first doped portion, the well extending from an upper surface of the first doped portion to a position above the first depth. At least one electrostatic discharge device is formed in the well.

A method for forming a semiconductor device includes forming a deep trench in a substrate having a first doped portion to a first depth and a second doped portion below the first depth, the deep trench extending below the first depth; doping a region around the deep trench to form a buried plate where the buried plate includes a dopant type forming an electrically conductive connection with the second doped portion of the substrate and being electrically insulated from the first doped portion; forming a deep trench capacitor in the deep trench using the buried plate as one electrode of the capacitor; forming an access transistor to charge or discharge the deep trench capacitor; and forming a well in the first doped portion.

Another method for forming a semiconductor device includes providing a retrograde substrate having a first doped portion to a first depth and a second doped portion below the first depth; forming a deep trench in the substrate, the deep trench extending below the first depth; doping a region around the deep trench to form a buried plate where the buried plate includes a dopant type forming an electrically conductive connection with the second doped portion of the substrate and being electrically insulated from the first doped portion; forming a deep trench capacitor in the deep trench using the buried plate as one electrode of the capacitor; forming an access transistor to charge or discharge the deep trench capacitor; forming a well in the first doped portion, the well having a different dopant type than the first doped portion.

Yet another method for forming a semiconductor device includes providing a semiconductor-on-insulator substrate having semiconductor material formed on a buried dielectric layer over a bulk retrograde substrate, the bulk retrograde substrate having a first doped portion to a first depth and a second doped portion below the first depth, wherein the first doped portion includes a p− doping and the second doped portion includes an n+ doping; forming a deep trench in the substrate, the deep trench extending below the first depth; doping a region around the deep trench to form a buried plate where the buried plate includes a dopant type forming an electrically conductive connection with the second doped portion of the substrate and being electrically insulated from the first doped portion; forming a deep trench capacitor in the deep trench using the buried plate as one electrode of the capacitor; forming a fin field effect access transistor in the semiconductor material to charge or discharge the deep trench capacitor; forming a contact, which extends through the first doped portion into the second doped portion to provide an electrical path between the buried plate and a ground; forming a well in the first doped portion by implanting dopants that extend from an upper surface of the first doped portion to a position above the first depth, the well having a different dopant type than the first doped portion; and forming an electrostatic discharge device in the well.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
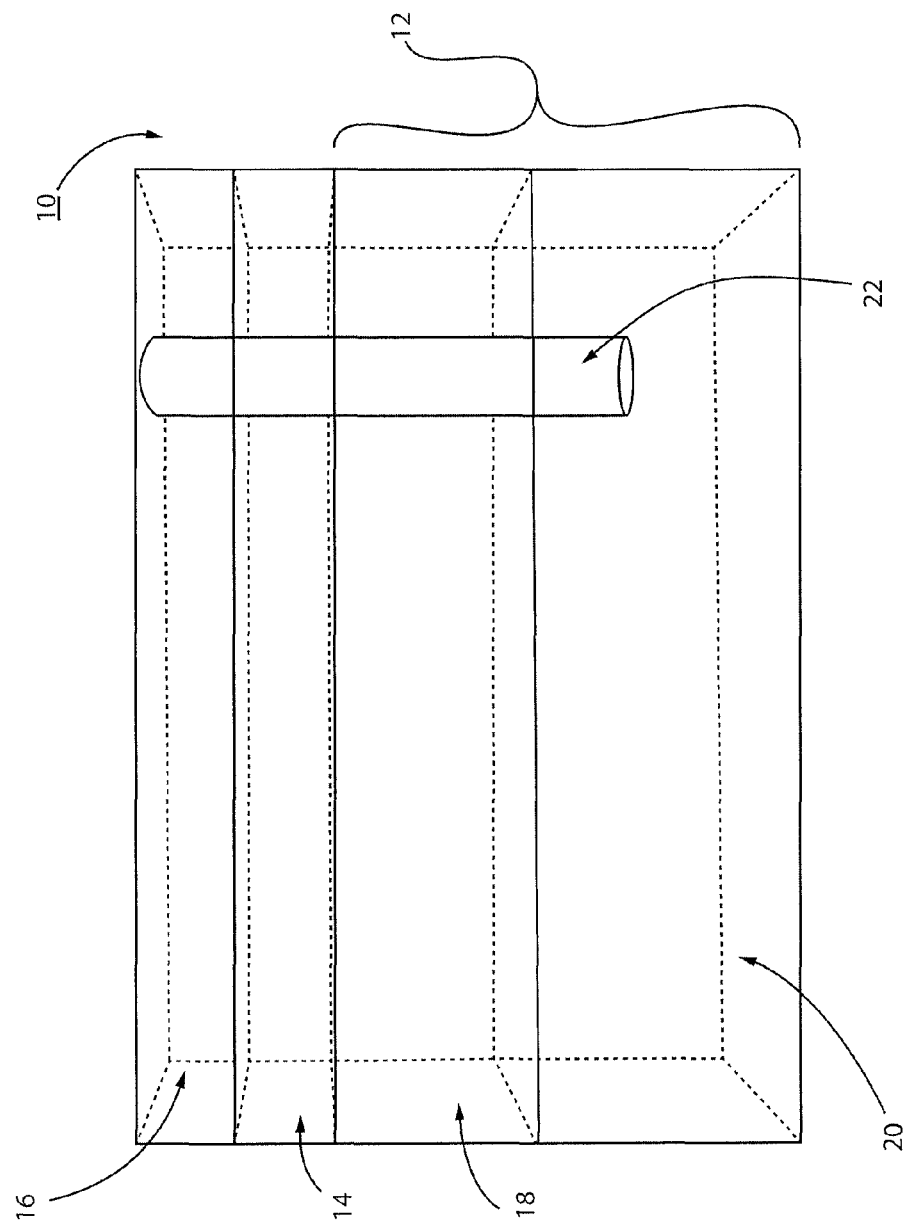
FIG. 1 is a perspective cross-sectional view of a semiconductor device showing a semiconductor-on-insulator substrate having a bulk substrate with two doped portions at different depths and a deep trench formed in accordance with the present principles.

In accordance with the present principles, a semiconductor substrate is processed to provide a deep trench buried plate and a buried well. In one embodiment, the substrate includes a retrograde substrate and is provided with a first doped substrate portion (e.g., with p$^-$ dopants)) and a second doped substrate portion (e.g., n+ dopants). Note that other combinations of dopants at different depths and concentrations are also contemplated. The retrograde substrate includes the second doped substrate portion deeper than the first doped substrate portion. A deep trench is formed through the first doped substrate portion and into the second doped substrate portion. A buried plate formed outside of the deep trench connects with the second doped portion to form a connective path to a ground. Doping of the buried plate for individual cells is achieved through conformal deposition and diffusion from a very thin doped layer formed inside the deep trench. By employing a similar doping type as the deeper second doped portion of the substrate, a better connection is made between buried plates and the ground.

A lower portion of the buried plates of all memory cells are connected within the second doped portion of the substrate. By making the buried plate connection within the second doped portion, the first doped portion is kept available for forming other device structures. In one particularly useful embodiment, the first doped region is employed for the formation of a buried well. In another embodiment, the first doped portion is employed for the formation of an electrostatic discharge (ESD) diode. In other embodiments, other devices, e.g., transistors, junctions, etc., are formed in the first doped substrate portion.

It should be understood that the addition or omission of small numbers of dopant atoms can change the ability of a semiconductor to conduct electricity. For example, when on the order of one dopant atom is added per 100 million lattice atoms, the doping is said to be low or light. The designation herein to represent low or light doping will be expressed as n– or p–. When many more dopant atoms are added, e.g., on the order of one dopant atom per ten thousand lattice atoms, the doping may be referred to as heavy or high. The designation herein to represent heavy or high doping will be expressed as n+ or p+. It should be noted that the amount of doping (+/–) and the conductivity (n/p) will collectively be referred to herein as dopant type. The dopant types are designated herein to change the charge flow properties of adjacent diffusion and dopant regions.

It is also to be understood that the present invention will be described in terms of a given illustrative architecture having a retrograde substrate; however, other architectures, structures, substrate materials and process features and steps may be varied within the scope of the present invention. In addition, the present principles will be described with respect to fin field effect transistors (FINFETs) for memory devices. It should be understood that other device structures are also contemplated, for example, metal oxide semiconductor (MOS) structures, complementary metal oxide semiconductor (CMOS), vertical devices, horizontal devices, planar devices, thin film transistors, etc. Any such structures may include a deep trench capacitor and be employed in accordance with the present principles. It should also be understood that while the deep trench capacitors may be employed in memory devices, such as dynamic random access memory (DRAM), embedded DRAM (eDRAM), synchronous DRAM (SDRAM), static RAM (SRAM), etc., other devices may include deep trench capacitors as well, e.g., processor chips, etc.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present principles may be embodied in a design for an integrated circuit chip that may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, a substrate 10 is illustratively shown in accordance with one illustrative embodiment. Substrate 10 may include a bulk substrate formed from a monocrystalline material such as Si, GaAs, Ge, SiGe, etc. In other embodiments, substrate 10 includes a semiconductor-on-insulator (SOI) substrate as depicted in FIG. 1. The SOI substrate includes a bulk material substrate 12, a buried dielectric layer 14 (e.g., a buried oxide layer (BOX)) and a semiconductor material 16. The bulk substrate 12 and the semiconductor material 16 may include the same material or different materials. The materials for bulk substrate 12 and semiconductor material 16 may include Si, SiGe, Ge, etc. Other materials are also contemplated.

Bulk substrate 12 includes a retrograde substrate having a first doped portion 18 and a second doped portion 20. The first doped portion 18 includes a first dopant type while the second doped portion 20 includes a second dopant type. The dopant types may be selected to provide functional benefits as described hereinafter. In one embodiment, the first dopant type includes p− dopants (e.g., boron), which may later be employed with a buried well formed therein. The buried well may include particular devices, such as an ESD diode, transistors, etc. The second dopant type is preferably compatible with a buried plate for a deep trench capacitor that will be formed, and may include n+ dopants (e.g., phosphorous).

Deep trenches 22 are formed by employing one or more deep trench patterning processes, which are known in the art. The formation of deep trenches may include forming a pattern (not shown) and employing a high anisotropic reactive ion etch to form the deep trenches 22 through the layers of the substrate 10. The reactive ion etch forms the deep trench through the semiconductor material 16, through the BOX layer 14 and through the bulk substrate 12. The depth of the deep trench 22 should extend sufficiently into the second doped portion 20 of the bulk substrate 12. The amount of extension into the second doped portion 20 depends on the connection resistance desired between buried plates of the deep trench capacitors and the second doped substrate 20 as will be described in greater detail below.

Figure 2:
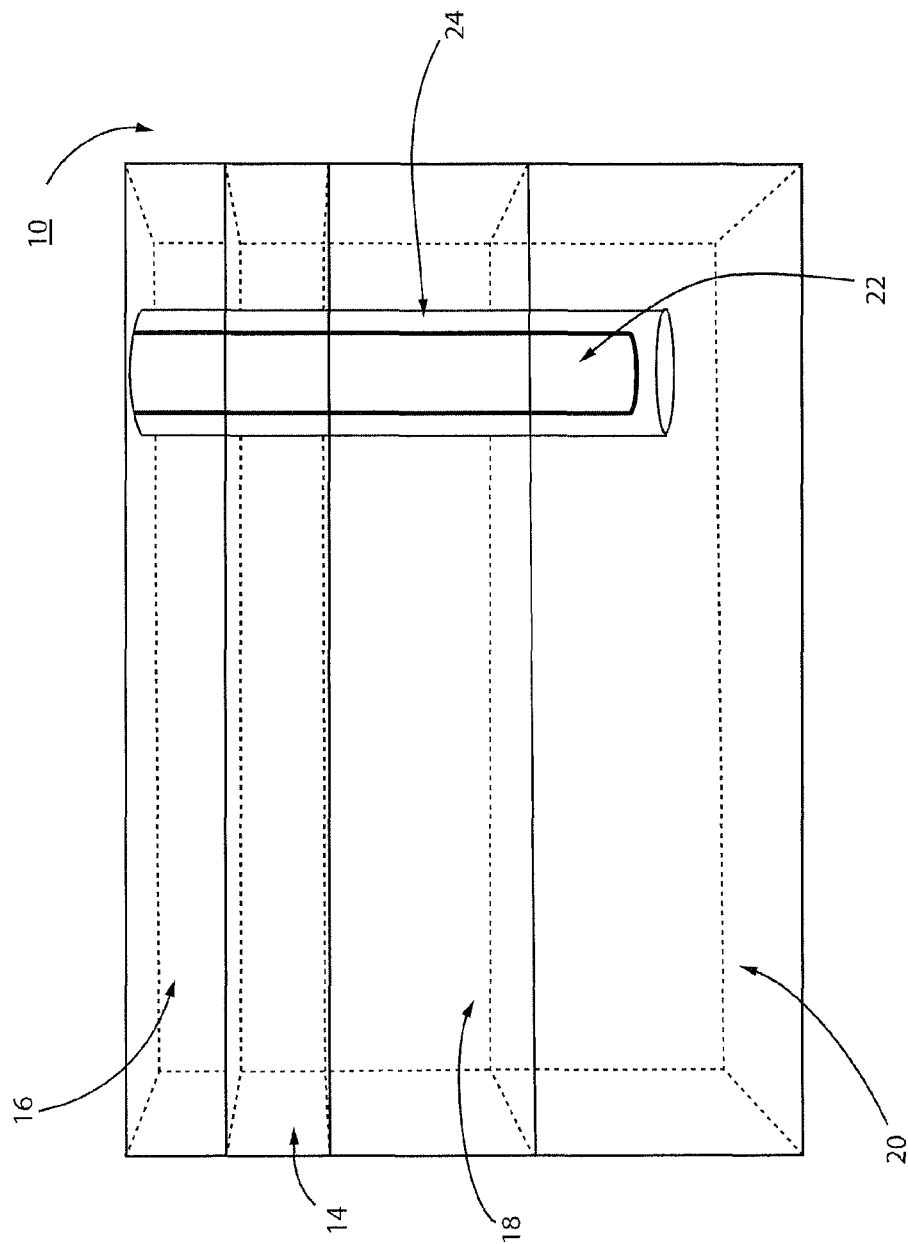
FIG. 2 is a perspective cross-sectional view of the device in FIG. 1 having a buried plate formed around the deep trench in accordance with the present principles.

Referring to FIG. 2, a buried plate 24 is formed outside the deep trench 22. The buried plate 24 is formed by doping an adjacent region around the deep trench 22. Different formation processes for the buried plate 24 may include a localized doping achieved through conformal doping (e.g., by plasma doping (PLAD) techniques (e.g., a semiconductor doping similar to ion implantation) or diffusion from a very thin layer doped layer (e.g., doped SiGe). The thin doped layer may be deposited in the deep trench 22 and annealed to cause the dopants to diffuse outward from the layer into adjacent regions of the substrate portions 18 and 20. The thin doped layer is then removed.

Any other suitable doping technique may also be employed. It is preferred that the dopant type of the buried plate 24 match or be compatible with the second dopant type of the second doped portion 20 to provide sufficient selective conduction between the buried plate 24 and the portion 20. The doping process also further extends the buried plate 24 deeper into the second doped portion 20.

Figure 3:
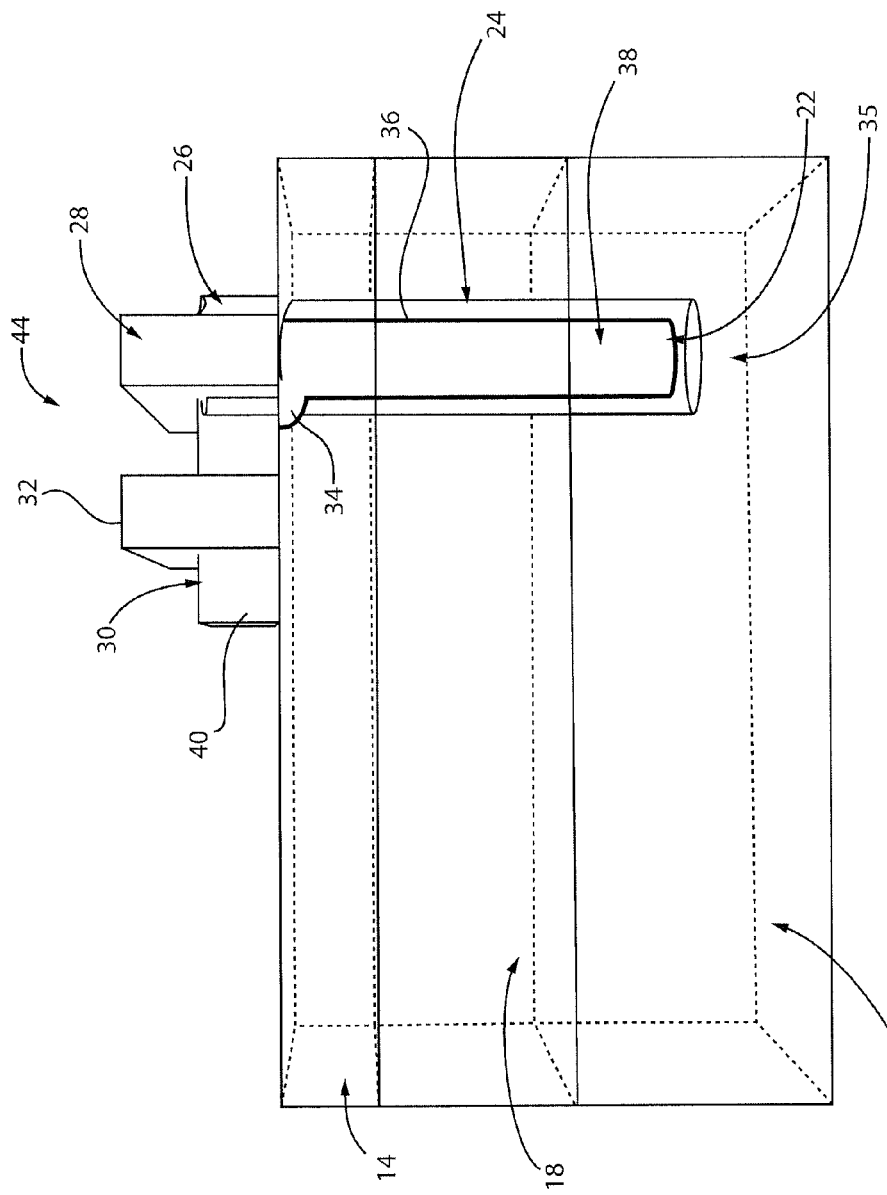
FIG. 3 is a perspective cross-sectional view of the device in FIG. 2 having a buried strap, trench top dielectric, access transistor, completed deep trench capacitor and wordlines formed in accordance with the present principles.

Referring to FIG. 3, a dielectric layer 36 is conformally formed within the deep trench 22. This dielectric layer or node dielectric 36 acts as a capacitor dielectric between capacitor nodes. The capacitor nodes include the buried plate 24 and a conductor 38 deposited in the deep trench 22 to form a deep trench capacitor 35. The dielectric layer 36 may include a high dielectric constant material (e.g., a high-k dielectric), such as, e.g., hafnium silicate, zirconium silicate, hafnium dioxide, zirconium dioxide, silicon oxynitride, etc. The dielectric layer 36 may be a few nanometers (e.g., 1-20 nm) thick. The conductor 38 filling the deep trench 22 may include copper, aluminum, tungsten or other suitable metals or alloys thereof. The conductor 38 may include other conductive materials as well, such as, e.g., doped polysilicon.

After the deep trench 22 is filled with the conductor 38, a trench top dielectric 26 (e.g., a trench top oxide (TTO)) is formed and patterned over the deep trench capacitor 35 to prevent discharge leakage. A buried strap 34 is formed adjacent to the deep trench. The buried strap 34 electrically connects the conductor 38 to an access transistor 30. The buried strap 34 forms a connection from the transistor 44 to the capacitor 35 to permit a switchable electrical connection with word lines, as will be described. The buried strap 34 may include a dielectric lining and a conductive portion that makes the electrical connection to the capacitor 35.

The semiconductor material 16 is patterned to forms fins 40, which provide a channel, source and drain regions for the transistor 30 formed for accessing the capacitor 35. The transistor 30 in this example includes a finFET, however, other types of access transistors may be employed. The formation of the finFET transistor 30 includes doping processes to form diffusion regions, channels, etc. as is known in the art. A wordline 32 forms a gate 32 for the transistor 30 and may be formed as a structure over the fin 40. In one embodiment, wordlines 32 and 28 are patterned from a conductive material (e.g., doped polysilicon) deposited over a surface of the device. Wordline 32 is an active wordline employed to control the transistor 30. Wordline 28 is a passive wordline employed to activate a nearby or adjacent transistor for another memory cell.

FIG. 3 depicts a memory cell 44 which includes the deep trench capacitor 35 and an access transistor 30. During operations, the deep trench capacitor 35 is read from or written to by storing charge or discharging charge from the capacitor using known techniques and read/write circuits. Memory cell 44 may be part of an array of memory cells formed on a same substrate 10 or chip. The chip may be part of a wafer having many chips formed thereon.

Figure 4:
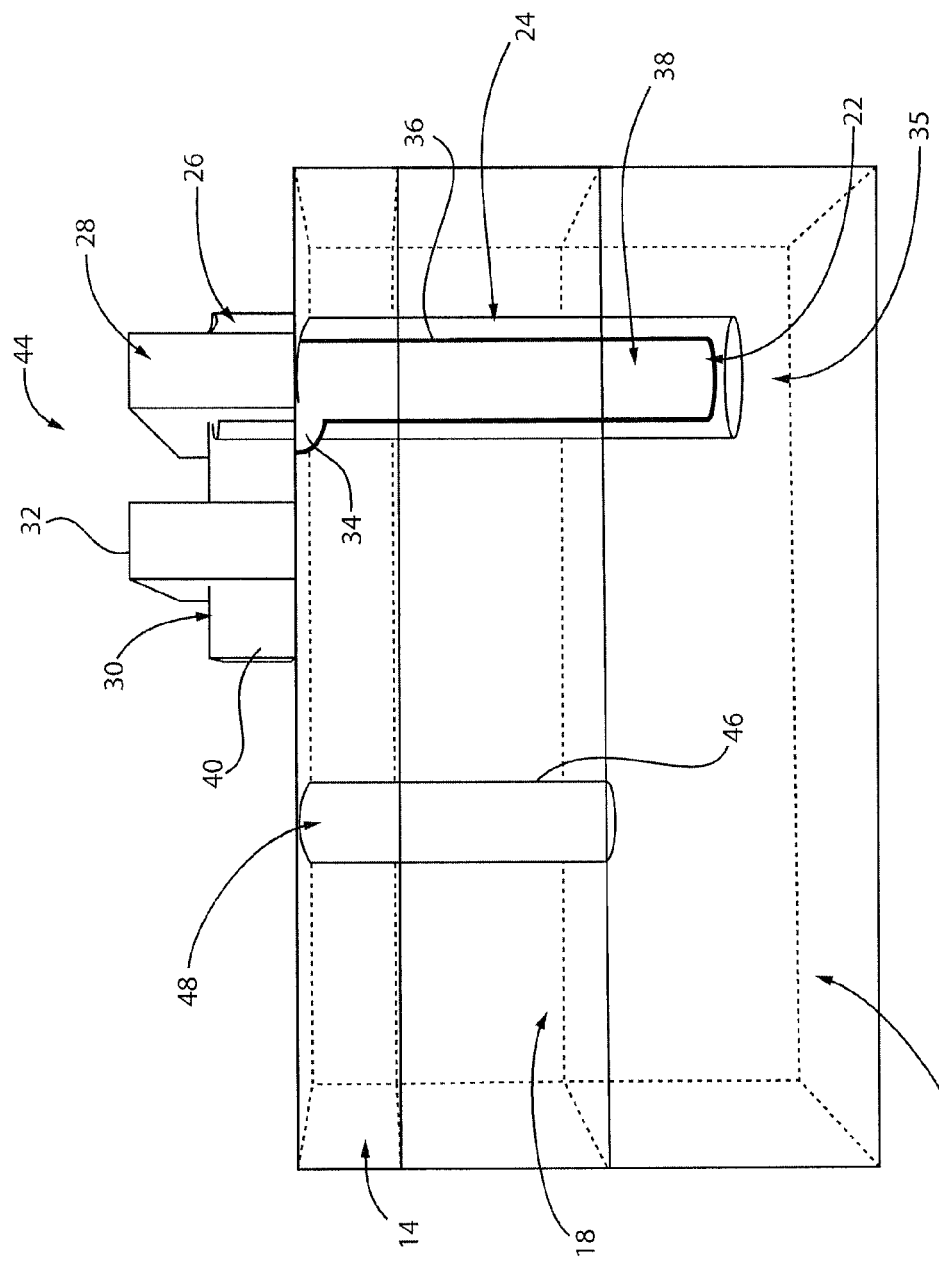
FIG. 4 is a perspective cross-sectional view of the device in FIG. 3 having a contact formed to provide an electrical path to ground from the buried plate in accordance with the present principles.

Referring to FIG. 4, after the formation of the memory cell 44, a contact hole 46 is formed through the dielectric layer 14, through the first doped substrate portion 18 and into the second doped substrate portion 20. The contact hole 46 is placed at a location where it will not interfere with other components (e.g., the access transistor 30), but is close enough to the buried plate 24 to enable selective electronic flow when enabled. A conductor is deposited in the contact hole 46 to form a contact 48. The contact 48 provides an electrical path through the first substrate portion 18 and the dielectric layer 14. An upper portion of the contact 48 will be connected to a ground plane or other grounding structure. This connection may be through other conductors or subsequently formed metal lines. In this way, an electrical path is formed between the grounding structure to the buried plate 24 through the contact 48 and through a portion of the second doped portion 20. The type of dopants selected for the buried plate 24 and the second doped portion 20 are the same or compatible to permit current flow therebetween.

The contact 46 is formed from a conductive material, such as metal, and in particular, copper, aluminum, tungsten, etc. to continue the electrical path to ground. The first doped portion 18 is doped with a dopant species configured to act as an insulator for the contact 46 and a portion of the buried plate 24 between the dielectric layer 14 and the second doped portion 20. In this way, the first doped portion 18 may be employed to form additional devices without discharging the additional devices to ground through the first doped substrate portion 18. Further, the portion of the buried plate 24 between the dielectric layer 14 and the second doped portion 20 will not exchange charge with the contact 46 and the buried plate 24 between the dielectric layer 14 and the second doped portion 20.

Figure 5:
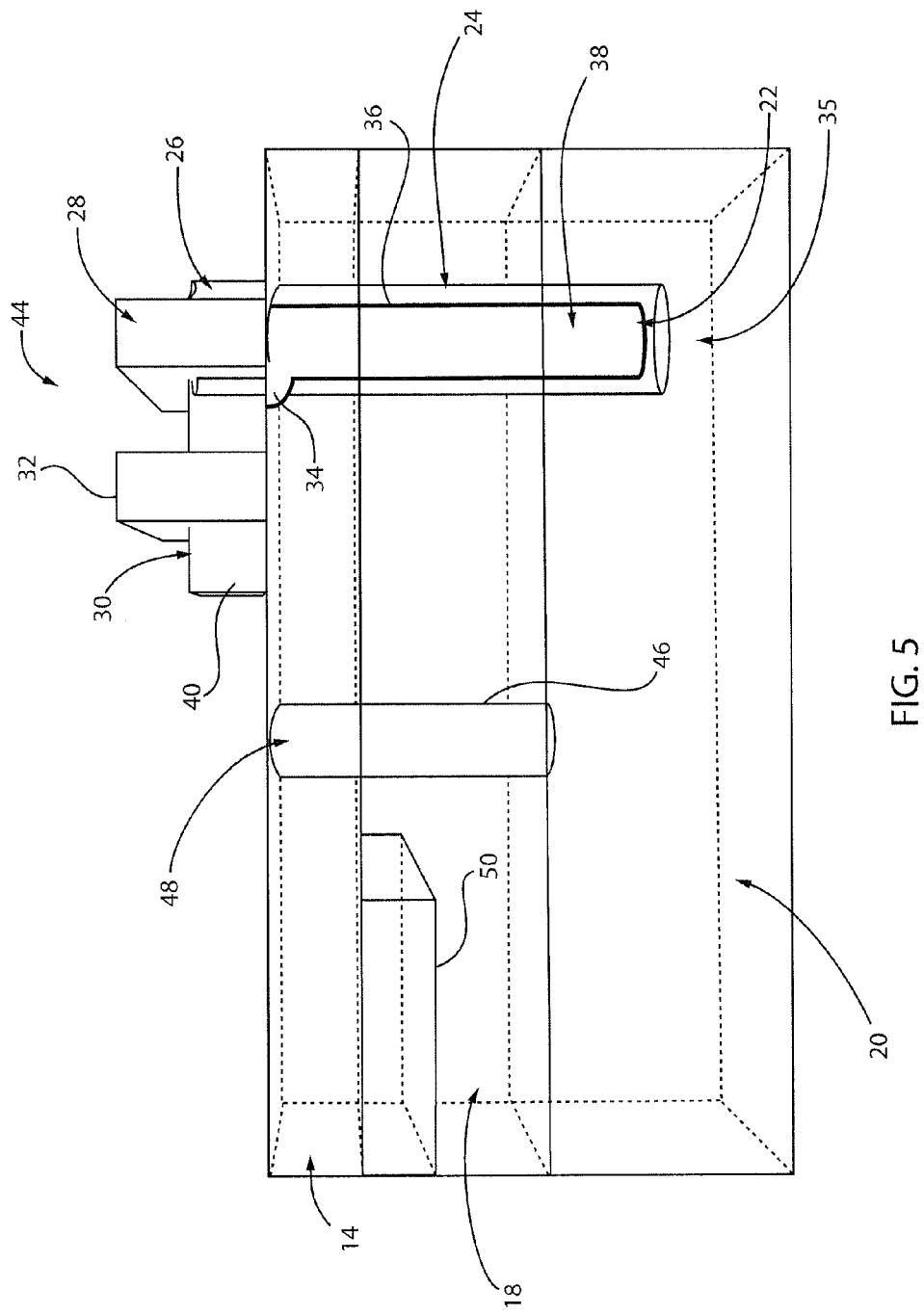
FIG. 5 is a perspective cross-sectional view of the device in FIG. 4 having a shallow well formed to provide a diffusion region for forming additional devices in accordance with the present principles.

Referring to FIG. 5, a well 50 may now be formed in the first doped portion 18. The well 50 may be formed by an ion implantation process through the dielectric layer 14. Well 50 is preferably a shallow well so that it is present at or near an interface (the top) between the dielectric layer 14 and the first doped portion 18. In this way, the well 50 may be easily accessed for the formation of additional devices. There devices may include transistors diodes, etc.

The well 50 may include a p+ dopant well or an n− dopant well depending on the function of the devices to be formed therein (e.g., if the first doped portion 18 is p− doped). The well 50 may be employed to form a body junction for the one or more additional devices to be formed. The structure in accordance with the present principles frees up the area in between the dielectric layer 14 and the first doped portion 18. This enables the formation of the shallow well 50 and junctions needed for other applications and avoids the challenges of counter doping a heavily doped substrate.

Figure 6:
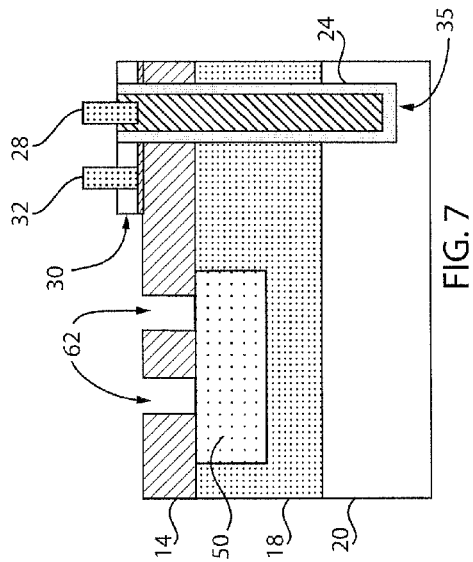
FIG. 6 is a cross-sectional view of the device in FIG. 5 showing a block mask formed over a memory cell to perform further processing in accordance with the present principles.

Referring to FIG. 6, further processing is performed to form an additional device in or on the shallow well 50. In one embodiment, the memory cell 44 is blocked off by a block mask 60 to protect components that have already been formed.

Figure 7:
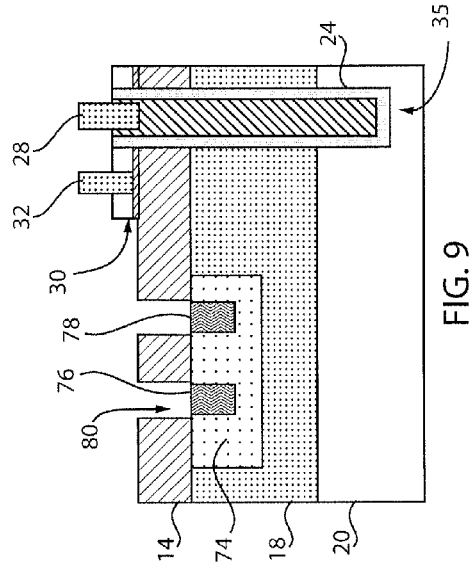
FIG. 7 is a cross-sectional view of the device in FIG. 6 showing openings formed in the buried dielectric layer to access the shallow well in accordance with the present principles.
Figure 8:
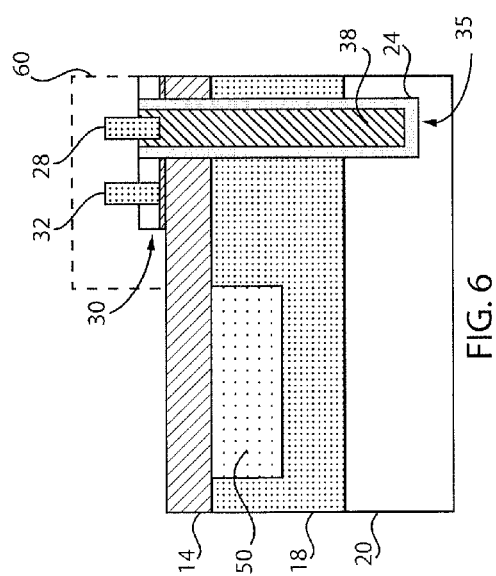
FIG. 8 is a cross-sectional view of the device in FIG. 7 showing the openings used to form diffusion regions for an electrostatic discharge diode in accordance with one embodiment.
Figure 9:
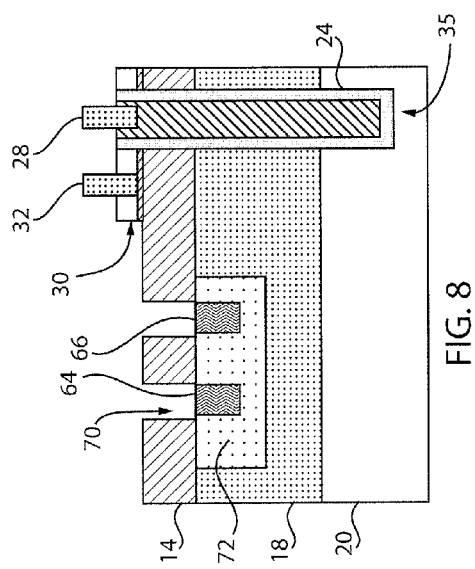
FIG. 9 is a cross-sectional view of the device in FIG. 7 showing the openings used to form diffusion regions for an electrostatic NPN junction in accordance with another embodiment.

Referring to FIG. 7, the dielectric layer 14 is opened up over the well 50. This may be performed by forming a mask (not shown) on the dielectric layer 14 and etching the dielectric layer 14 in accordance with the mask. The etching process may include, e.g., a reactive ion etch. The etching results in openings 62 formed through the dielectric layer 14, exposing the well 50. Further processing may result in different devices being formed. In a particularly useful embodiment, an electrostatic discharge device may be fabricated and employed to assist in controlling static surface charge that may accumulate. FIGS. 8 and 9 show two different embodiments of such a discharge device. It should be understood that the shallow well may be employed for other devices and applications as well.

Referring to FIG. 8, the openings 62 are employed to dope respective diffusion regions 62 and 66 in a shallow well 72. The regions 64 and 66 may be alternately blocked and subjected to an implantation process, or a deposition of a doped layer may be formed in contact with the exposed surface of the well 72 to provide appropriate dopant types and densities for the formation of an ESD diode 70. In one embodiment, the well 72 includes an n− dopant, the region 64 includes a p+ type dopant and the region 66 includes an n+ type dopant. The diode 70 includes a lateral p+/n− body junction. Additional processing includes forming electrical contacts to the diffusion regions of the diode 70.

The present principles overcome the very difficult task of counter doping a heavily doped substrate when forming additional wells, for example for devices such as the ESD diode 70. The diode 70 being formed in the well 72 provides a large volume gain, which is reclaimed from the first doped portion 18 in accordance with the present principles. As a result of the large volume well 72, the diode 70 benefits from lower resistance and less thermal heating due to the size and location of the diode 70 relative to other structures as provided in accordance with the present principles.

Referring to FIG. 9, an alternate embodiment uses the openings 62 to dope respective diffusion regions 76 and 78 in a shallow well 74. The regions 76 and 78 may be alternately blocked and subjected to an implantation process, or a deposition of doped layer may be formed in contact with the exposed surface of the well 74 to provide appropriate dopant types and densities for the formation of an ESD NPN junction 80. In one embodiment, the well 74 includes a p+ dopant, the regions 76 and 78 include an n+ type dopant forming a lateral NPN type device or junction 80. The junction 80 being formed in the well 74 also provides a large volume gain, which is reclaimed in accordance with the present principles. The junction 80 also benefits from lower resistance and less thermal heating in accordance with the present principles. Other devices or additional devices may be formed in the shallow wells.

Figure 10:
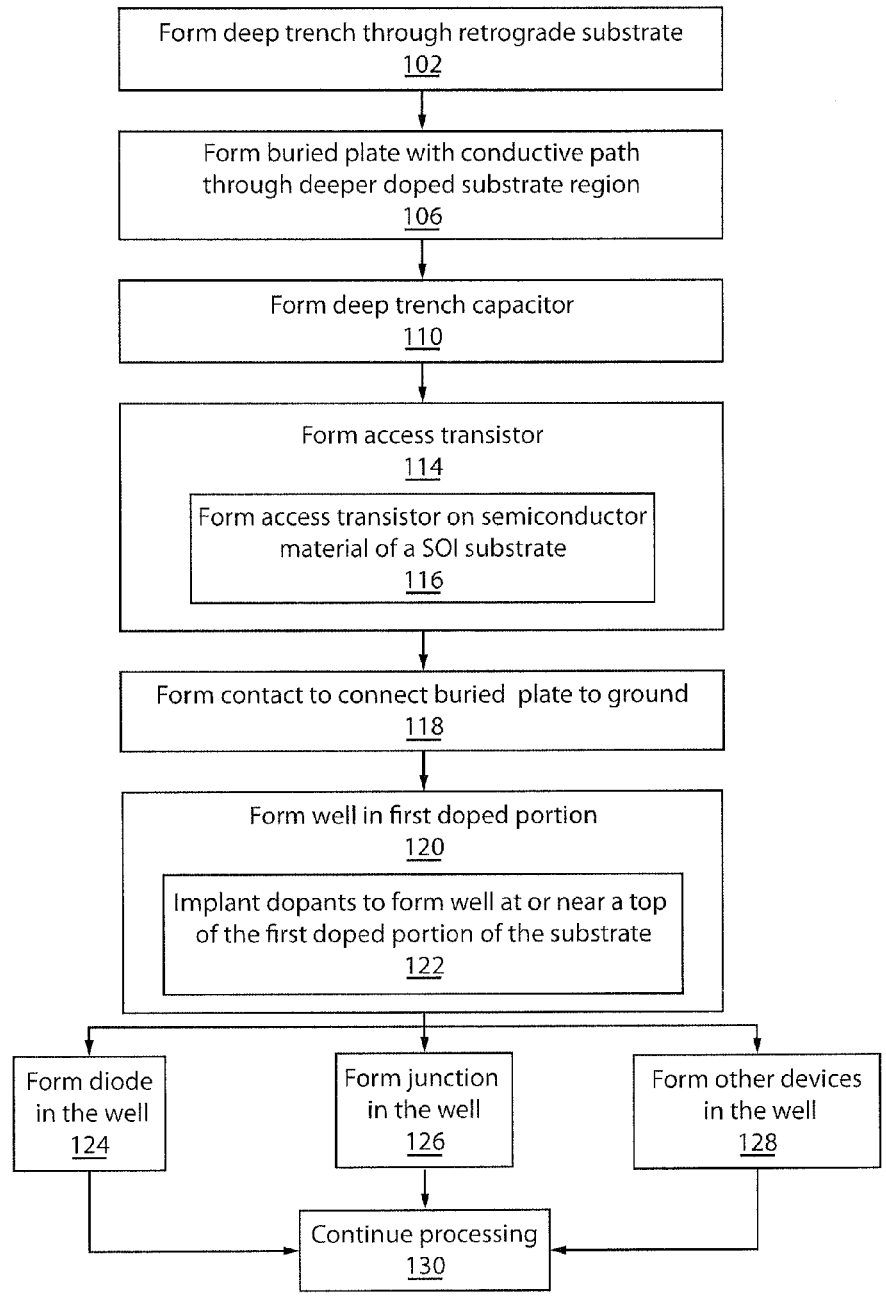
FIG. 10 is a block/flow diagram showing illustrative methods for making a semiconductor device in accordance with present principles.

Referring to FIG. 10, a flow diagram depicts illustrative methods for forming a semiconductor device in accordance with the present principles. In block 102, a deep trench is formed in a substrate having a first doped portion to a first depth and a second doped portion below the first depth. The deep trench extends below the first depth. In one embodiment, the first doped portion includes a p− type dopant, and the second doped portion includes an n+ type dopant. In a particularly useful embodiment, the substrate may include a semiconductor-on-insulator substrate having semiconductor material formed on a buried dielectric layer over a bulk substrate.

In block 106, a region around the deep trench is doped to form a buried plate where the buried plate includes a dopant type forming an electrically conductive connection with the second doped portion of the substrate and being electrically insulated from the first doped portion. A region around the deep trench is doped to form a buried plate by doping the region with n+ dopants when the second doped portion includes n+ dopants. In block 110, a deep trench capacitor is formed in the deep trench using the buried plate as one electrode of the capacitor.

In block 114, an access transistor is formed to charge or discharge the deep trench capacitor. In block 116, forming the access transistor may include forming the access transistor in the semiconductor material of a SOI substrate. The access transistor may include a fin field effect transistor although other transistor types may be employed.

In block 118, a contact may be formed that extends through the first doped portion into the second doped portion to provide an electrical path between the buried plate and a ground.

In block 120, a well may be formed in the first doped portion. The well is formed in a region between or under access transistors of adjacent memory cells and avoids electrical connections with the trench capacitor due to the doping profiles of the substrate and the well. In block 122, the well may be formed by implanting dopants that extend from an upper surface of the first doped portion to a position above the first depth. The ion implantation may include an angled implantation to adjust the lateral position of the well to fit under surface structures. The well has different dopant types then its surrounding first doped portion. In one embodiment, for example, the well includes an n− doping when the first doped portion includes a p− doping. In another embodiment, the well includes a p+ doping when the first doped portion includes a p− doping.

In block 124, one or more diodes may be formed in the well. In one embodiment, the one or more diodes include at least one ESD diode. The ESD diode may include n+ and p+ diffusion regions if the well includes an n− dopant type. In block 126, one or more NPN junctions may be formed in the well. In one embodiment, the NPN junction may include n+ diffusion regions if the well includes a p+ dopant type. In block 128, other device types may be formed in the well. These may include transistor, diodes, or other components. The dopant types and the devices described as being formed in the well are illustrative. Other dopant combinations and device types are also contemplated. It is also envisioned that multiple devices of the same or different types may be formed in a single well.

In block 130, processing continues to complete the semiconductor device. The semiconductor may include a memory device or other integrated circuit device. Further processing may include the formation of contacts, metallization, inter-level dielectrics, packaging, etc.

Having described preferred embodiments for a retrograde substrate for deep trench capacitors (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
   a substrate having a first doped portion to a first depth and a second doped portion below the first depth;
   a deep trench capacitor formed in the substrate and extending below the first depth, the deep trench capacitor having a buried plate, the buried plate including a dopant type forming an electrically conductive connection with second doped portion of the substrate and being electrically insulated from the first doped portion;
   a contact extending through the first doped portion into the second doped portion to provide an electrical path between the buried plate and a ground; and
   a well formed in the first doped portion above the first depth.

2. The semiconductor device as recited in claim 1, wherein the first doped portion includes a p− type doping and the second doped portion includes an n+ type doping.

3. The semiconductor device as recited in claim 2, wherein the buried plate includes an n+ type doping.

4. The semiconductor device as recited in claim 1, wherein the substrate includes a semiconductor-on-insulator substrate having semiconductor material formed on a buried dielectric layer over the substrate, the semiconductor material having an access transistor for the deep trench capacitor formed in the semiconductor material.

5. The semiconductor device as recited in claim 1, wherein the access transistor includes a fin field effect transistor.

6. The semiconductor device as recited in claim 1, wherein the well extends from an upper surface of the first doped portion.

7. The semiconductor device as recited in claim 1, wherein the well includes an n− doping when the first doped portion includes a p− doping.

8. The semiconductor device as recited in claim 1, wherein the well includes a p+ doping when the first doped portion includes a p− doping.

9. The semiconductor device as recited in claim 1, further comprising a diode formed in the well.

10. The semiconductor device as recited in claim 1, further comprising a transistor formed in the well.

11. The semiconductor device as recited in claim 1, further comprising a NPN junction formed in the well.

12. A semiconductor device, comprising:
    a semiconductor-on-insulator substrate having a bulk substrate, a buried dielectric layer and a semiconductor material, the bulk substrate including a first doped portion to a first depth and a second doped portion below the first depth;
    a memory cell comprising an access transistor formed in the semiconductor material and a deep trench capacitor formed in the bulk substrate and extending below the first depth, the deep trench capacitor having a buried plate, the buried plate including a dopant type forming an electrically conductive connection with second doped portion of the substrate and being electrically insulated from the first doped portion;
    a contact extending through the first doped portion into the second doped portion to provide an electrical path between the buried plate and a ground; and
    a well formed in the first doped portion, the well having a different dopant type than the first doped portion.

13. The semiconductor device as recited in claim 12, wherein the first doped portion includes a p− doping and the second doped portion includes an n+ doping.

14. The semiconductor device as recited in claim 13, wherein the buried plate includes an n+ doping.

15. The semiconductor device as recited in claim 12, wherein the access transistor includes a fin field effect transistor.

16. The semiconductor device as recited in claim 12, wherein the well extends from an upper surface of the first doped portion, and the well includes at least one of a diode or NPN junction formed in the well.

17. The semiconductor device as recited in claim 12, wherein the well includes an n− doping when the first doped portion includes a p− doping and includes a p+ doping when the first doped portion includes a p− doping.

18. A semiconductor device, comprising:
    a semiconductor-on-insulator substrate having a bulk substrate, a buried dielectric layer and a semiconductor material, the bulk substrate including a first doped portion includes a p− doping to a first depth and a second doped portion includes an n+ doping below the first depth;
    a memory cell comprising a fin field effect access transistor formed in the semiconductor material and a deep trench capacitor formed in the bulk substrate and extending below the first depth, the deep trench capacitor having a buried plate, the buried plate including a dopant type forming an electrically conductive connection with second doped portion of the substrate and being electrically insulated from the first doped portion;
a contact extending through the first doped portion into the second doped portion to provide an electrical path between the buried plate and a ground;
a well formed in the first doped portion, the well having a different dopant type than the first doped portion, the well extending from an upper surface of the first doped portion to a position above the first depth; and
at least one electrostatic discharge device formed in the well.

* * * * *